United States Patent [19]

Rich et al.

[11] Patent Number: 4,742,261
[45] Date of Patent: May 3, 1988

[54] CONSTANT LENGTH STRUT

[75] Inventors: Wiley F. Rich, Arlington, Va.; Gregory H. Ames; William A. Williams, Jr., both of Colorado Springs, Colo.

[73] Assignee: Kaman Aerospace Corporation, Arlington, Va.

[21] Appl. No.: 940,909

[22] Filed: Dec. 10, 1986

[51] Int. Cl.$^4$ .......................................... H01L 41/08
[52] U.S. Cl. ..................................... 310/328; 310/316
[58] Field of Search ............... 310/323, 328, 330–332, 310/346, 316, 314, 317, 319; 248/550, 1, 200, DIG. 1, 351, 354.1

[56] References Cited

U.S. PATENT DOCUMENTS

| | | | |
|---|---|---|---|
| 4,160,184 | 7/1979 | Ljung | 310/328 |
| 4,186,324 | 1/1980 | Hartzell, Jr. | 310/330 X |
| 4,406,965 | 9/1983 | Ljung | 310/330 X |
| 4,408,832 | 10/1983 | Hartman et al. | 310/328 X |
| 4,438,364 | 3/1984 | Morison | 310/331 X |
| 4,471,257 | 9/1984 | Kleinschmidt | 310/328 |
| 4,473,768 | 9/1984 | Kerr et al. | 310/329 |

Primary Examiner—Mark O. Budd
Attorney, Agent, or Firm—McCormick, Paulding & Huber

[57] ABSTRACT

A constant length strut includes an axially elongated body having a fixed attachment point at one end and an attachment point carried at its opposite end and supported for axial movement toward and away from the fixed attachment point. A quartz reference rod is connected at one end to one attachment point and extends internally for substantially the length of the strut. The free end of the reference rod moves axially lengthwise relative to the other attachment point as the strut changes length due to thermal expansion and contraction or tensile and compressive loading. A positional displacement transducer senses this relative movement. An electrical signal directly proportional to the displacement excites a linear actuator connected between the telescopic attachment point and the strut body to provide a corrective displacement to maintain the strut at a constant length.

14 Claims, 3 Drawing Sheets

CONSTANT LENGTH STRUT

BACKGROUND OF THE INVENTION

The present invention relates generally to structural elements used in forming structural assemblies and frameworks and deals more specifically with a constant length strut for use in constructing such an assembly or framework.

It is known that structural assemblies and frameworks change their geometric shape due to the effects of thermal expansion and contraction and changes in mechanical loading on structural elements or struts used for attaching and interconnecting the various structural components of such structural assemblies. Although such changes are generally very small, they may have a significant affect on the accuracy of precision equipment and apparatus, such as, for example, optical measuring systems and the like supported by the structural assembly. It is desirable therefore, to provide a strut that maintains a constant length between attachment points by actively controlling deflections in the strut due to thermal expansion and contraction and due to changes in tensile and compressive loading so that the geometric shape of an assembly constructed with the struts is precisely controlled.

It is an object therefore, of the present invention to provide a strut having a constant length between attachment points.

It is another object of the present invention to provide a constant length strut having active compensation for deflections due to thermal expansion and contraction and changes in tensile and compressive loading.

It is a further object of the present invention to provide a strut that operates as an element of a closed loop servocontrol system to maintain a desired constant length between attachment points.

Other objects and advantages of the invention will be readily apparent from the following description and claims taken in conjunction with the accompanying drawings.

SUMMARY OF THE INVENTION

The present invention resides in a constant length strut comprising an axially elongated body having a fixed termination at one end of the body for attachment to a first external structure with which the strut is used and a second termination carried at the opposite end of the body, and movable lengthwise of the body, for attachment to a second external structure. An axially elongated reference element extends lengthwise of the body and has a substantially fixed length. One end of the reference element is fixedly attached to the one termination and moves axially with that termination toward and away from the other termination. The opposite, unattached free end of the reference element is coupled to a measuring system for sensing relative displacement of that end of the reference element toward and away from the other termination as the reference element moves with the one termination. This measuring system generates an electrical displacement signal having a magnitude related to the relative displacement of the two terminations. A linear actuator is coupled between the second termination means and the strut body and drives the second termination toward and away from the first termination in response to the relative displacement signal to provide a corrective displacement to maintain a constant length between the first and second termination.

In a preferred embodiment, the reference element is an axially elongated rod which has a near zero coefficient of thermal expansion. The linear actuator is responsive to the displacement signal. The measuring system includes an eddy current positional displacement transducer comprising a conductive target fixed to the free end of the quartz rod and disposed between a first and second electric coil arranged equidistant from the target and at opposite sides of the target. The circuit includes means for producing an electric signal representative of and related to the displacement of the target and accordingly a deflection in the length of the strut. The displacement electric signal is used to control a voltage source for exciting the linear actuator which actuator exerts a force on the second termination to move the second termination with respect to the first termination to apply a corrective displacement to maintain the strut at a constant length.

DETAILED DESCRIPTION OF THE PREFERRED EMBODIMENTS

Figure 1:
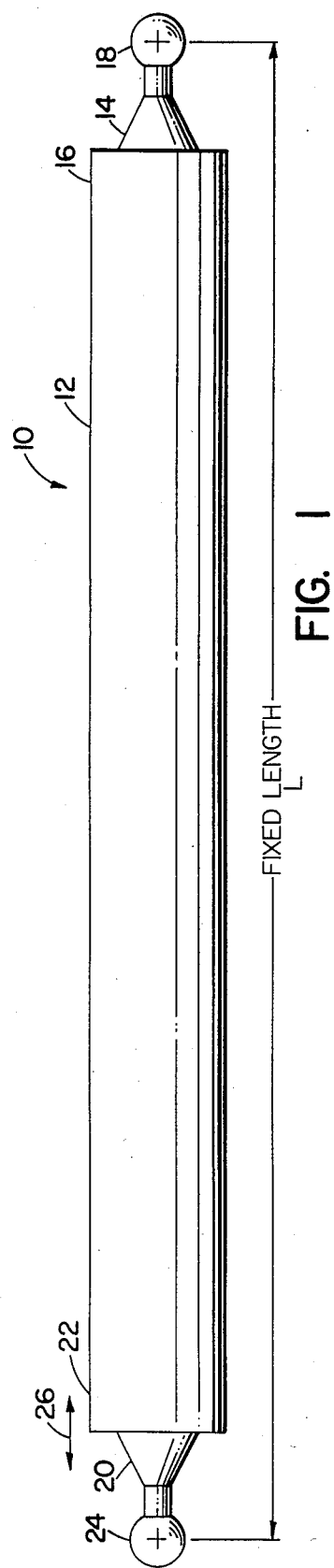
FIG. 1 is a schematic view of a constant length strut embodying the present invention.

Turning now to the drawings and considering FIG. 1 in particular, a somewhat schematic view of a constant length structural element or strut is shown and designated 10. The strut 10 includes an axially elongated, tubular body 12 made of stainless steel or other suitable material well known to those skilled in the art. The strut 10 has a termination 14 fixedly connected to the body 12 at one end 16 of the body. The termination 14 is arranged with a precision ball end 18 which extends axially beyond the end of the body 12 and is used to connect one end 16 of the strut 10 to an external structure with which the strut is used. The strut 10 also includes a moving termination 20 telescopically received by the opposite end 22 of the body 12. The moving termination 20 is also arranged with a precision ball end 24 used to connect the end 22 to an external structure with which the strut is used. The moving termination 20 is arranged for linear movement within and relative to the body 12 in the direction of arrow 26 to provide corrective displacement maintaining a fixed length L between the precision ball ends 18 and 24. Such corrective displacement compensates for deflections in the strut 10 due to thermal contraction and expansion or changes in tensile or compressive loading of the strut as explained in further detail below.

Figure 2:
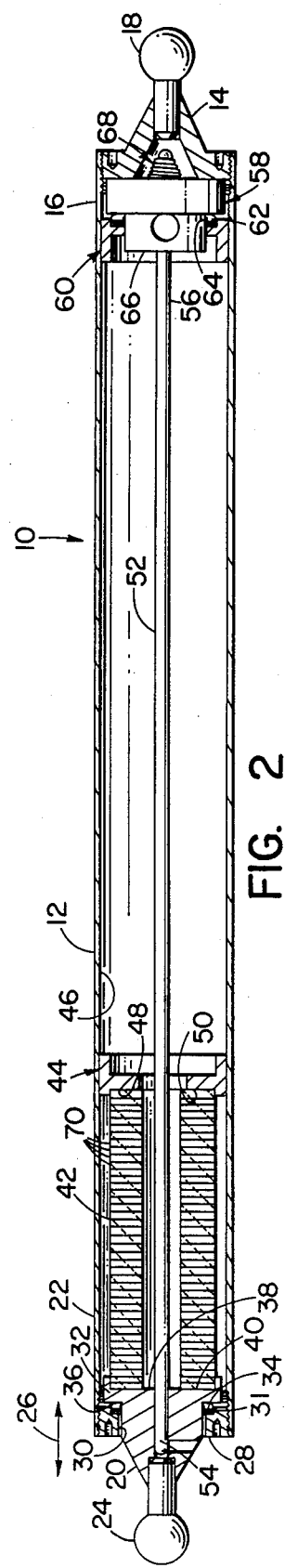
FIG. 2 is an axial cross-sectional view of the strut of FIG. 1.

Turning now to FIG. 2, a cross-sectional view is shown revealing the major component elements comprising an eddy current positional displacement transducer 58, a reference length element 52 and a linear actuator such as, for example, the piezoelectric motor 42 of the constant length strut 10 of FIG. 1. The linear actuator may be any suitable type well known in the art. A lock ring 28 is threadably screwed to the inner diameter of the body 12 at end 22 and includes an aperture 30 through which the moving termination 20 moves in the direction of arrow 26. The moving termination 20 includes an annular flange 32 having a circumference larger than the aperture 30 which prevents the moving termination 20 from moving out of the strut body 12. The inner portion of the moving termination 20 includes a recessed surface 38 arranged for complementary engagement with one end 40 of the piezoelectric motor 42. A load spring 34 in the form of a wave washer is located between an inner surface 31 of the lock ring 28 and a shoulder surface 36 of the flange 32. The load spring 34 urges the moving termination 20 axially toward the end 16 of the body 12 and into engagement with the one end 40 of the piezoelectric motor 42. A disc shaped stop 44 is welded to the inner portion 46 of the body 12 and includes an annular shoulder 48 arranged for complementary engagement with the other end 50 of the piezoelectric motor 42.

The reference length element 52 is an elongated rod and is fixedly coupled at one end 54 to the moving termination 20 and moves axially in the direction of arrow 26 as the termination 20 moves. The opposite end 56 of the rod 52 is free and coupled to the positional displacement transducer 58 as explained in greater detail in conjunction with the discussion of FIGS. 3 and 5. The reference rod 52 is made of a material having a very low coefficient of thermal expansion and preferably is quartz. Also, as illustrated in FIG. 2, the reference rod 52 is coaxial with the body 12 and is surrounded by a gap which provides a "thermos bottle" effect to minimize heat transfer from the body 12 to the rod 52. Consequently, the effects of thermal expansion and contraction of the reference rod 52 and accordingly movement of the positional displacement transducer 58 is due to a deflection of the strut 10 rather than thermal expansion and contraction of the reference rod 52.

A disc shaped stop 60 is welded to the inner surface 46 of the body 12 near the end 16 and at the side of the transducer 58 nearest the moving termination 20. A preload spring 62 in the form of a wave washer is located between one surface 64 of the stop 60 and one surface 66 of the transducer 58 to urge the components of the transducer body 58 into complementary engagement with each other as shown in detail and explained in conjunction with FIG. 3. The transducer body 58 has an axial bore through which the free end 56 of the reference rod 52 passes. A tension spring 68 is coupled to the free end 56 of the rod 52 to impart a slight tension to the reference rod 52.

The piezoelectric motor 42 is generally well known to those skilled in the art and functions as a linear actuator to drive the moving termination 20 and accordingly the precision ball end 24 in a direction toward and away from the fixed termination 14. The piezoelectric motor 42 is responsive to an applied electrical signal related to and derived from the output of transducer 58 and axially expands or contracts in accordance with the applied signal to make a corrective change in length to compensate for a deflection between the precision ball ends 18 and 24. The piezoelectric motor 42 may be of any suitable piezoelectric material such as, for example, lead zirconate titanate (PZT) ceramic. The piezoelectric motor 42 comprises a number of piezoelectric discs arranged in a continuous stack wherein each of the discs is fabricated from the PZT material. The discs have the property of changing their physical dimension in response to a voltage potential of the proper magnitude and polarity placed across the discs. The ends 40 and 50 of the piezoelectric motor are electrically insulated from the remaining portions of the strut 10. The piezoelectric discs 70,70 are in the shape of a washer so that the reference rod 52 passes axially through the opening formed in the stack of discs.

Figure 3:
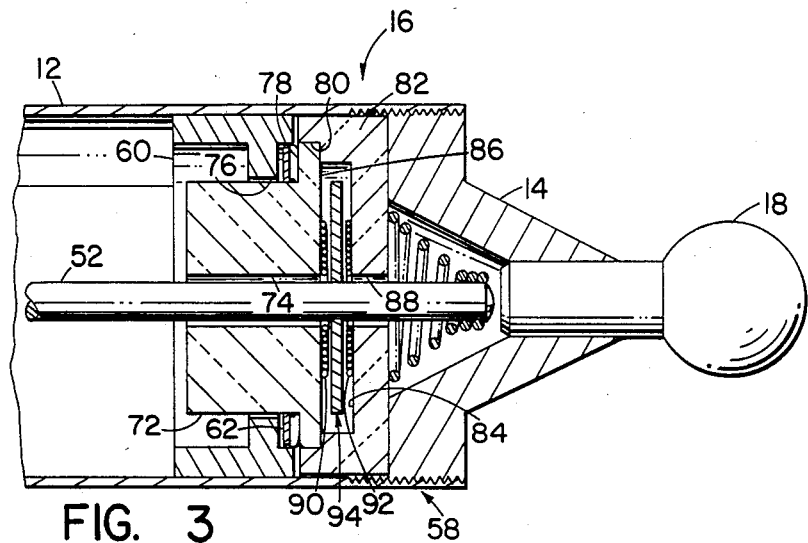
FIG. 3 is a somewhat exploded view showing in greater detail the eddy current positional transducer and fixed termination and attachment point of the strut of FIG. 2

Considering FIG. 3, a fragmentary somewhat exploded view of the eddy current positional displacement transducer 58 is shown in cross-section revealing the component parts of the transducer. The transducer 58 comprises two halves for ease of assembly. One half includes a shoulder body portion 72 having an axial bore 74 through which the reference rod 52 passes. The body 72 has a diameter somewhat less than the diameter of an aperture 76 in the stop 60 so that the body 72 moves coaxially in the aperture 76. The body 72 includes a flange 78 arranged for complementary engagement with a recess 80 in another body portion 82 which is the other half of the transducer 58. The body 82 is disc shaped and includes a relieved portion 84 which forms a cavity in the area between one surface 86 of the body 72 and the relieved surface 84 when the body 82 is in complementary engagement with the body 72. The body 82 includes threads around its periphery and is arranged for threadable engagement with threads located along the inner surface of the strut body 12 at the end 16. The preload spring 62 is located between one surface of the stop 60 and the flange portion 78 of the body 72 and urges the body 72 into complementary engagement with the body 82. The body 82 also includes an axial bore 88 which is in registry with the axial bore 74 in the body 72 to permit the reference rod 52 to pass therethrough.

Electromagnetic coils or sensors 90 and 92 are mounted on surfaces 86 and the relieved portion 84, respectively and are arranged coaxially with the reference rod 52. A conductive target 94 is disc shaped and is mounted coaxially on the reference rod 52 for axial movement with the rod 52. The target 94 is located equidistant from the sensors 90 and 92. The eddy current positional displacement transducer 58 operates on the principle of impedance variation caused by eddy currents induced in a conductive target located within the range of each of the sensors 90 and 92. The positioning of the conductive target 94 is made equidistant from the sensors 90 and 92 when the strut 10 is at desired length that is to remain constant.

Figure 4:
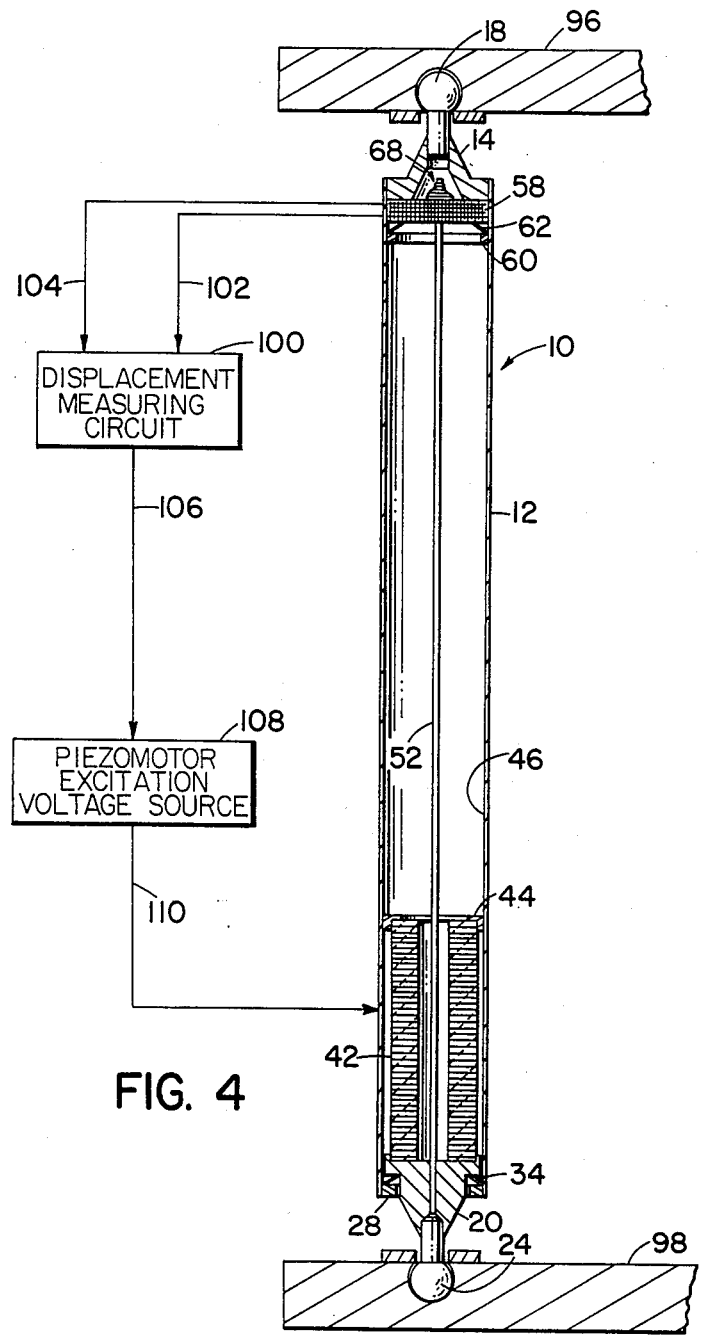
FIG. 4 is a somewhat schematic, cross-sectional view of the constant length strut of FIG. 1 showing the strut attached at its respective termination ends to associated external structures. The strut is shown as an element of a servocontrol system for maintaining a constant displacement between the termination ends.

Turning now to FIG. 4, a somewhat schematic view of the constant length strut embodying the present invention is shown in a cross-sectional view wherein the precision ball end 18 is attached to an external structure 96 to couple one end of the strut 10 to the structure 96 and the precision ball 24 is shown connecting an external structure 98 to the moving termination coupling 20 of the strut 10. The sensors 90 and 92 are electrically connected to the input of a displacement measuring circuit 100 through electrical conductors 102 and 104, respectively.

The displacement measuring circuit 100 is sensitive to an electrical signal present on either of the inputs 102 and 104 and provides an output electrical signal on lead 106 which signal has a magnitude directly proportional to the displacement of the moving termination coupling 20 with respect to the fixed termination coupling 14. The output electric signal is coupled to a piezoelectric motor excitation voltage source 108 and is used to control the source 108. The piezoelectric motor excitation voltage source 108 produces a voltage on lead 110 which is coupled to the piezoelectric motor 42 and causes the piezoelectric motor to change dimensionally by expanding or contracting to provide a corrective displacement in a direction opposite from the displacement direction sensed by the transducer 58. As the deflection is compensated for, the displacement error sensed by the transducer 58 becomes smaller and smaller as the length of the strut approaches the desired constant length of the strut.

The piezoelectric motor excitation voltage source 108 may be one of a number of circuits well known to those skilled in the art. Of necessity, the design of such a voltage source 108 must be capable of providing a voltage potential having a magnitude and polarity compatible with the piezoelectric material used in the piezoelectric motor.

The displacement measuring circuit 100 may be of a suitable electrical circuit design and sensitivity for providing a signal directly proportional to the movement of the conductive target 94 located between the sensors 90 and 92. The circuit 100 design is made to be sensitive to strut length deflection yet relatively insensitive to changes in length caused by vibration. Preferably, a differential measuring system such as one available from Kaman Measuring Systems of Colorado Springs, Colo. referred to as a differential impedance transducer and specifically identified as a KD-5100 Differential Measuring System is used to provide the desired output control signal representative of the deflection or relative movement of the conductive target from the initial position corresponding to the constant length of the strut. A schematic block diagram of a typical displacement measuring circuit is shown in FIG. 5 and briefly explained below.

Figure 5:
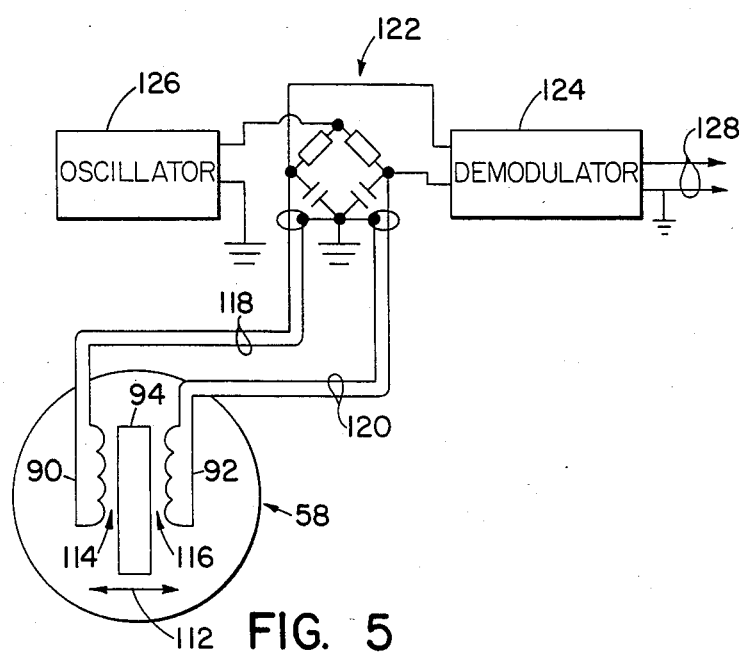
FIG. 5 is a schematic representation of an eddy current positional displacement transducer and instrumentation bridge circuit comprising a portion of the displacement measuring circuit of FIG. 4.

Considering now FIG. 5, a schematic block diagram representative of the above-referenced KD-5100 system is shown. The eddy current positional displacement transducer 58 is shown schematically and includes sensors 90 and 92 and a conductive target 94 arranged for movement in the direction of arrow 112. The operation of the displacement measuring circuit 100 uses the principle of impedance variation caused by eddy currents induced in the conductive target 94 located within the range of the sensors 90 and 92. The strength of the electromagnetic coupling between sensors 90 and 92 and the conductive target 94 depends upon the gap 114 between the sensor 90 and the target 94 and the gap 116 between the sensor 92 and the target 94. Each sensor 90 and 92 is electrically connected via a conductor pair 118 and 120 respectively to opposite legs of an instrumentation bridge circuit designated generally 122. The specific design of the bridge circuit is such that the bridge is balanced and the differential output voltage signal from the bridge is zero when the sensors 90 and 92 are equidistant from the conductive target 94. The sensors are equidistant at the centered or null position of the conductive target 94 and which position corresponds to the length of the strut which is to be maintained constant. As the conductive target 94 moves from the null position away from one of the sensors 90 and 92 and toward the other of the sensors 90 and 92, the electromagnetic coupling between each sensor and the conductive target 94 is no longer equal and causes an impedance imbalance which is detected by the bridge circuit. The differential output voltage signal in the illustrated circuit is connected to a demodulator 124 which demodulates the bridge output signal produced by the well known operation of the combination of the oscillator 126 and the bridge circuit 122. The output signal from the demodulator 124 appears across the output conductor pair 128 and is a linear analog signal having a magnitude directly proportional to the conductive target position. An eddy current positional displacement transducer of the type used with the present invention provides a greater displacement sensitivity than a capacitive micrometer gauge used with piezoelectric stacks. The eddy current transducer described above provides a sensitivity in the range of $+/-$ 2nM (nanometers) relative displacement. Consequently, the constant length strut of the present invention utilizing a feedback loop as described above and an elongated rod as a reference length element also as described above, said reference length element being subject to thermally-induced changes in length of a few nanometers, provides precise, linearly repeatable relative positioning to an accuracy of approximately $+/-$ 5nM.

A constant length strut for precisely maintaining a fixed length between two ends has been described wherein corrective changes in the length of the strut are made to compensate for deflections caused by thermal expansion and contraction and tensile and compressive loading. Although the constant length strut of the present invention is disclosed with an eddy current transducer arranged to cooperate with a quartz reference rod having a near zero coeffient of thermal expansion to produce a signal representative of a deflection in the length of the strut, it will be understood that other distance measuring systems, such as, for example, an optical distance measuring system may be used to sense a deflection in the length of the strut. It will also be understood that numerous other modifications and substitutions may be implemented without departing from the spirit and scope of the invention and therefore the invention has been described by way of illustration rather than limitation.

I claim:

1. A constant length structural element, said element comprising:
   an axially elongated body having a first end portion and a second end portion disposed axially opposite said first end portion;
   a first termination fixed to said first end portion of said body and adapted for attachment to a first external structure with which said element is used;
   a second termination carried by said second end portion of said body for movement lengthwise of said body and adapted for attachment to a second external structure with which said element is used;
   an axially elongated reference element having a substantially fixed length and a first and second end, said first end being attached to one of said terminations for moving with said one termination axially toward and away from the other of said terminations and said second end being supported by means for maintaining said reference element in tension;
   sensor means coupled between said reference element and said other termination for sensing axial displacement of said one termination toward and away from said other termination with respect to a reference position, said reference position being the position of said second end of said reference element with respect to said one of said terminations to which said first end of said reference element is attached when said structural element is at an initial length corresponding to a desired constant length between said two terminations;

means responsive to said sensor means for generating an electrical signal having a magnitude related to the axial displacement of said second termination with respect to said first termination means, and actuator means coupled between said second termination and said second end portion of said body for driving said second termination toward and away from said first termination in response to said axial displacement electrical signal for providing a corrective displacement maintaining said second termination at a constant distance from said first termination.

2. A constant length structural element as defined in claim 1 wherein said axially elongated body is a tube.

3. A constant length structural element as defined in claim 1 wherein said second termination means is coaxial with said tube and is supported for limited axial movement relative to said tube, said second end portion including means for limiting the axial movement of said second termination means away from said first termination.

4. A constant length structural element as defined in claim 3 wherein said limiting means comprises:

an annular locking device fixedly connected to said second end portion of said body, said locking device having a centrally located axial opening extending between an inner and outer surface of said locking device and arranged so that said second termination means moves axially within said centrally located opening, and biasing means coupled between said inner surface of said locking device and said second termination means for urging said second termination means toward said first termination means.

5. A constant length structural element as defined in claim 1 wherein said sensor means includes a differential measuring system, said system comprising a conductive target, a first and second electrical coil each coil being disposed a predetermined distance from said target and at opposite sides of said target, each of said first and second coils inducing an eddy current in said conductive target to produce an electromagnetic coupling between each of said first and second electrical coils and said conductive target that is equal in strength for both of said first and said second coils when said coils are equidistant from said conductive target.

6. A constant length structural element as defined in claim 5 wherein said conductive target is attached near said second end of said reference element and equidistant from said first and second electrical coils, said first electrical coil being located on a surface portion of a first half of a transducer body connected to said first end portion of said structural element body at a side of said conductive target closest to said second termination and said second electrical coil being located on a surface portion of a second half of a transducer body connected to said first end portion of said structural element body at a side of said conductive target furthest from said second termination.

7. A constant length structural element as defined in claim 1 wherein said reference element comprises an axially elongated rod made of a material having a very low coefficient of thermal expansion.

8. A constant length structural element as defined in claim 7 wherein said reference element material is quartz.

9. A constant length structural element as defined in claim 1 wherein said actuator means comprises a piezoelectric motor.

10. A constant length structural element as defined in claim 9 wherein said piezoelectric motor is excited by voltage source means coupled to said piezoelectric motor for applying a voltage potential to said piezoelectric motor to cause said piezoelectric motor to expand and contract in accordance with the magnitude and polarity of the voltage potential applied and in an amount to provide a corrective displacement.

11. A constant length structural element as defined in claim 6 wherein said means for generating said relative displacement signal includes said first and second electric coils being electrically coupled to a first and second arm respectively of an instrumentation bridge electric circuit, said bridge circuit being balanced when said first and second coils are equidistant from said conductive target and said bridge circuit being arranged to provide a differential output voltage potential when said conductive target moves away from one of said first and second electric coils and toward the other of said first and second electric coils, respectively.

12. A constant length structural element as defined in claim 11 further including:

means for comparing the magnitude of the differential output voltage potential to the magnitude of the relative displacement voltage signal, and means for generating an error signal having a magnitude related to the difference between said bridge differential output voltage potential corresponding to said structural element having a length different from said constant length and a bridge differential output voltage potential when said bridge is balanced corresponding to said structural element having a length equal to said constant length, said error signal being used to excite said actuator means whereby said structural element length is continually increased or decreased to maintain said structural element at a constant length.

13. A constant length strut, said strut comprising:

an axially elongated tube having a first end and a second end and made of a rigid material;

a first attachment means for attaching said first end to an external structure used with said strut, said first attachment means being fixed to said first end of said tube;

a second attachment means for attaching said second end to an external structure used with said strut, said second attachment means being telescopically connected to said second end of said tube and arranged for limited axial movement within a region of said second end;

an axially elongated reference rod made of a material having a low coefficient of thermal expansion, said rod having a fixed end and a free end, said fixed end being attached to said second attachment means for moving said rod axially lengthwise toward and away from said first end of said tube, said rod extending a substantial distance lengthwise into said tubes;

a positional displacement transducer connected at said first end of said tube in the region of said free end of said reference rod, said positional displacement transducer being coupled to said free end of said reference rod for sensing the axial displacement of said second attachment means as said tube expands and contracts;

piezoelectric motor means located internally within said tube and coupled between said second attachment means and said tube for moving said second attachment means toward and away from said first termination end means, and means responsive to said positional displacement transducer and coupled to said piezoelectric motor means for generating an electrical signal related to the axial displacement of said second attachment means with respect to said first attachment means to excite said piezoelectric motor means, said piezoelectric motor means providing a corrective displacement to compensate for said sensed axial displacement to maintain a constant length between said first and second attachment means.

14. A constant length strut as defined in claim 13 wherein said positional displacement transducer comprises an eddy current transducer.

* * * * *